United States Patent
Matsuda et al.

(10) Patent No.: US 7,227,223 B2
(45) Date of Patent: Jun. 5, 2007

(54) POWER MOS TRANSISTOR HAVING TRENCH GATE

(75) Inventors: Noboru Matsuda, Kanagawa-ken (JP); Hitoshi Kobayashi, Kanagawa-ken (JP); Masaru Kawakatsu, Kanagawa-ken (JP); Akihiko Osawa, Kanagawa-ken (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 26 days.

(21) Appl. No.: 10/618,624

(22) Filed: Jul. 15, 2003

(65) Prior Publication Data

US 2004/0012051 A1    Jan. 22, 2004

Related U.S. Application Data

(63) Continuation of application No. 09/667,559, filed on Sep. 22, 2000, now abandoned.

(30) Foreign Application Priority Data

Sep. 24, 1999    (JP)    ............................ 11-269922

(51) Int. Cl.
- H01L 29/76    (2006.01)
- H01L 29/94    (2006.01)
- H01L 31/062   (2006.01)
- H01L 31/113   (2006.01)
- H01L 31/119   (2006.01)

(52) U.S. Cl. .................. 257/330; 257/331; 257/332
(58) Field of Classification Search ............... 257/330, 257/331, 332
See application file for complete search history.

(56) References Cited

U.S. PATENT DOCUMENTS

| 4,663,644 | A |   | 5/1987 | Shimizu |
| 5,714,775 | A | * | 2/1998 | Inoue et al. ............... 257/139 |
| 5,889,700 | A |   | 3/1999 | Bergemont et al. |
| 6,049,108 | A |   | 4/2000 | Williams et al. |
| 6,060,747 | A | * | 5/2000 | Okumura et al. ......... 257/331 |
| 6,265,744 | B1|   | 7/2001 | Okumura |
| 6,396,102 | B1| * | 5/2002 | Calafut ..................... 257/331 |

FOREIGN PATENT DOCUMENTS

| JP | 6-169069  | 6/1994  |
| JP | 11-330466 | 11/1999 |

* cited by examiner

Primary Examiner—Phat X. Cao
(74) Attorney, Agent, or Firm—Oblon, Spivak, McClelland, Maier & Neustadt, P.C.

(57) ABSTRACT

A semiconductor device, and particularly an MOS transistor device, wherein in order to increase a channel region density and to achieve a low resistance of a transistor device there is provided a first gate electrode group having a plurality of gate electrodes formed on a semiconductor substrate to be away from each other at first equal spacings, a second gate electrode group having a plurality of gate electrodes formed on the semiconductor substrate to be away from each other at the first equal spacings, a source contact portion formed away from the first or the second gate electrode group at a second spacing, and source regions for electrically interconnecting the first gate electrode group and the source contact. The source regions are connected to each other at one end of the first gate electrode group, and separated at the other end of the first gate electrode group. In addition, the gate electrodes of the first group are connected each other at the other end. The second spacing is greater than the first spacing.

18 Claims, 7 Drawing Sheets

POWER MOS TRANSISTOR HAVING TRENCH GATE

CROSS-REFERENCE TO RELATED APPLICATIONS

This application is a continuation of U.S. patent application Ser. No. 09/667,559 filed Sep. 22, 2000, abandoned, which claims benefit of priority under 35 U.S.C. 119 to Japanese Patent Application No. P11-269922 filed Sep. 24, 1999, the entire contents of which are incorporated by reference herein.

BACKGROUND OF THE INVENTION

1. Field of the Invention

The present invention relates to a structure of a power MOS transistor having a trench gate.

2. Discussion of the Background

FIG. 1 is a plan view showing a spline-structured MOS transistor manufactured based on current product design rules. Trench gates 45 and source contacts 46 are alternately formed on a semiconductor substrate. Each of the source contacts 46 is connected to a source electrode formed on a layer formed further thereon.

FIG. 2 is an upper surface view showing a pattern of an offset mesh-structured MOS transistor manufactured based on current product design rules. Trench gates 38 and source contacts 44 are alternately formed on a semiconductor substrate. Each of the source contacts 44 is connected to a source electrode formed on a layer formed further thereon. The offset mesh type is designed to realize a high degree of integration by forming transistors in longitudinal and lateral directions. In this MOSFET, an arraying ratio of the trench gates 38 and the source contacts 44 is set at 1:1. In other words, one trench gate and one source contact constitute one MOSFET.

FIG. 3 is a detailed sectional view of the MOS transistor shown in FIG. 2, taken along the lines 6—6 shown in FIG. 2. Now, the structure of this section will be described, as well as a method of manufacturing a semiconductor device including such structure.

First, as shown in FIG. 3, an N-type epitaxial layer 32 is formed on, for example an N+ type semiconductor substrate 31. On the surface of this epitaxial layer 32, a double diffused layer composed of a P-type base diffused layer 33 and an N+ type source diffused layer 34 is formed. Then, after an SiO film is formed on the source diffused layer 34, the resultant structure is subjected to patterning by a resist. Using this as a mask, the SiO film is punched. The resist is removed, and then using the SiO film as a mask, a trench 35 is formed to a depth punching through the base diffused layer 33. Subsequently, a gate insulating film 36 is formed on a full surface, and a polysilicon film 37 for a gate electrode is formed on the gate insulating film 36. Then, the polysilicon film 37 is removed until the surface of the gate insulating film 36 is exposed, and a trench gate 38 is formed.

Subsequently, to separate the trench gate 38 from the source contact, an interlayer film 39 is formed on a full surface. Using a resist (not shown) formed on the interlayer film 39 and then patterned, the interlayer film 39 is removed, and a contact hole 40 is formed to a depth punching through the source diffused layer 34. Then, impurity ions are implanted by using the interlayer film 39 as a mask, and a P+ type diffused layer 41 is formed in the bottom portion of the contact hole 40 inside the base diffused layer 33. Subsequently, a barrier metal layer 42 is formed on the full surface. An aluminum film 43 is formed on this barrier metal layer 42, and a source contact 44 is formed.

FIG. 4 is a sectional view showing a flow passage of a current when a voltage is applied to the MOS transistor shown in FIG. 3. When a drain voltage is applied to the semiconductor substrate 31, a channel region 45 is formed from the semiconductor substrate 31 to near the side face of the trench gate 38. A current flows from a drain through the channel region 45 to the diffused layer 34. The diffused layer 34 becomes a source region.

In this case, an increase in a channel density of the channel region 45 facilitates the flow of a current, making it possible to reduce the device resistance of the MOSFET. Accordingly, to increase the number of channel regions 45, the number of trench gates 38, at the side faces of which channel regions 45 are formed, may be increased within a given region.

However, an increase in the number of trench gates 38 necessitates an increase in the number of source contacts 44. If a spacing between the trench gate 38 and the source contact 44 is small, shifting occurs in matching during a photo engraving process (PEP). An extra gate and source spacing must be provided for the trench gate 38 and the source contact 44. However, if an unexpected increase in the number of source pitches reduces the gate and source spacing, a reduction also occurs in the amount of margin between the gate and the source, resulting in a short-circuit failure therebetween.

Furthermore, if an opening of the source contact 44 is reduced, and the number of source pitches is increased in a given region, an aspect ratio of the contact hole 40 is increased, resulting in the impossibility of sufficient formation of the barrier metal layer 42 on the side face of the contact hole 40. The insufficient formation of the layer 42 causes reaction between the aluminum of the aluminum film 43 and the silicon of the substrate, which in turn generates aluminum spikes. Thus, because of improper formation of a depletion layer, current leakage occurs between the drain and the source.

SUMMARY OF THE INVENTION

The present invention was made to solve the foregoing problems, and it is an object of the invention to provide a semiconductor device having a trench gate, which is capable of increasing a channel region density and achieving low device resistance.

This and other objects are achieved according to the present invention by providing a novel semiconductor device including a first electrode gate group having a plurality of gate electrodes formed on a semiconductor substrate to be away from each other at first equal spacings; and a source contact having a portion formed separated from a first gate electrode of the first electrode gate group by a second spacing greater than the first spacing.

According to another aspect of the present invention, there is provided a semiconductor device including a first gate electrode group having a plurality of gate electrodes formed on a semiconductor substrate to be away from each other at first equal spacings; a source contact portion formed separated from the first gate electrode group to be away from the first gate electrode groups at a second spacing; and source regions for electrically interconnecting the first gate electrode group and the source contact, wherein the source regions are connected to each other at one end of the first gate electrode group, and separated from each other at the other end of the first gate electrode group.

According to a further aspect of the present invention, there is provided a semiconductor device including a first electrode gate group having a plurality of gate electrodes formed on a semiconductor substrate to be away from each other at first equal spacings; a second gate electrode group having a plurality of gate electrodes formed on the semiconductor substrate to be away from each other at the first equal spacings; a source contact portion formed between the first and second gate electrode groups to be away from the first and second gate electrode groups at a second spacing; and source regions for electrically interconnecting the first gate electrode group and the source contact portion. In this case, the source regions are connected to each other at one end of the first gate electrode group, and separated from each other at the other end of the same. Preferably, the second spacing is greater than the first spacing.

Since the source regions are connected to each other at one end, and separated from each other at the other end, a channel density can be increased, making it possible to achieve low device resistance for the semiconductor device. In addition, since one source contact has a plurality of trench gates, the number of regions and an area between a source and a gate can be reduced.

In the semiconductor device of the invention, the source contact portion and the first gate electrode group constitute one MOS transistor. By combining MOS transistors having such configuration, low resistance and a high degree of integration can be achieved.

The semiconductor device of the invention further comprises a source electrode on the semiconductor substrate, and the source contact portion is an electrode drawn from a source electrode. Because of this drawn electrode, it is not necessary to form any source electrodes on the front face on the semiconductor substrate. Even if the source electrode is formed in a predetermined region, it can be drawn out, contributing to higher device integration.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

A more complete appreciation of the present invention and many of its attendant advantages will be readily obtained by reference to the following detailed description considered in connection with the accompanying drawings, in which, FIG. 1 is a plan view showing a pattern of a conventional line-structured MOS transistor;

DETAILED DESCRIPTION OF THE PREFERRED EMBODIMENTS

The present invention relates to a structure of a power MOS transistor having a trench type gate electrode. The power MOS transistor is designed to obtain power by interconnecting a number of micro-pattern MOSFET cells in parallel. In general, the power MOS transistor is suited for a high-speed operation because of its fast switching speed. As regards its usage, this transistor is used for a switching power source, a motor control circuit, a wide-band power amplifier, and so on. The power MOS transistor is classified into a spline type and a mesh type, depending on the arrangements of trench gates and source contacts, and there is a difference in a degree of integration for the MOS transistor between these types. Configurations of the MOS transistors are nearly similar to each other.

Figure 5:
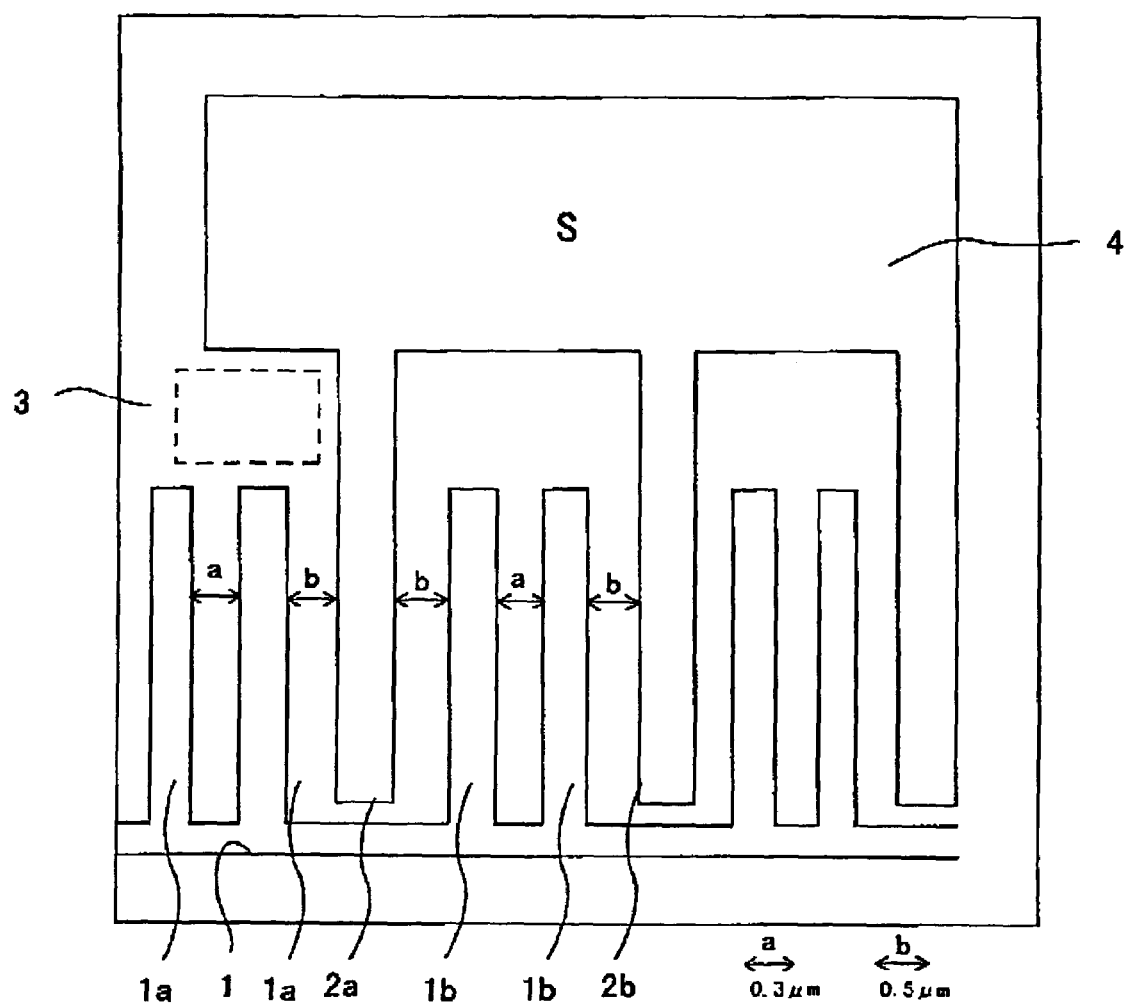
FIG. 5 is a plan view showing a pattern of a line-structured MOS transistor according to the invention.
Figure 6:
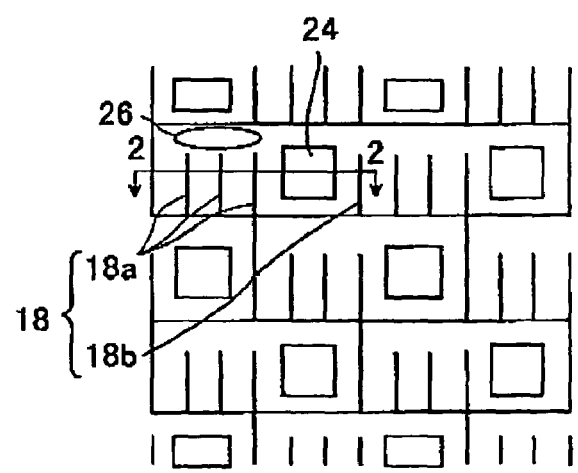
FIG. 6 is a plan view showing a pattern of an offset mesh-structured MOS transistor according to the invention.

Referring now to the drawings, where like reference numerals refer to the same or corresponding parts throughout the several views, and firstly referring to FIGS. 5 and 6 thereof, the concept of the present invention is first described.

FIG. 5 is a plan view of the power MOS transistor of the invention, showing an example of applying the configuration of the invention to a spline-structured MOS transistor.

The MOS transistor includes a first gate electrode group 1 having a plurality of gate electrodes 1a and 1b formed on a semiconductor substrate to be away from each other at first equal spacings (a); a second gate electrode group 2 having a plurality of gate electrodes 2a and 2b formed on the semiconductor substrate to be away from each other at the first equal spacings (a); and a source contact portion 2 formed between the first and second gate electrode groups to be away the first or second gate electrode group at a second spacing (b). The MOS transistor further includes source regions 3 for electrically interconnecting the first gate electrode group and the source contact portion. These source regions 3 are connected to each other at one end of the first gate electrode group, and separated from each other by trench gates 1a and 1b at the other end of the first gate electrode group. Preferably, the spacings (b) are greater than the spacings (a).

According to the invention, one source contact 2 has a plurality of trench gates. In addition, the source contact 2 is set as an electrode drawn from a source electrode 4 formed on an upper layer. Since the source contact is a drawn electrode, formation of a source region in one place will eliminate the necessity of forming such regions on the full surface of the semiconductor substrate.

FIG. 6 is a plan view showing a case of applying the configuration of the invention to an offset mesh-structured MOSFET. The MOSFET includes a first gate electrode group 18 having a plurality of gate electrodes 18a formed on a semiconductor substrate to be away from each other at first equal spacings; a second gate electrode group 18 having a plurality of gate electrodes 18b formed on the semiconductor substrate to be away from each other at the first equal spacings; and a source contact portion 24 formed between the first and second gate electrode groups to be away from the first or the second gate electrode group at a second spacing. The MOSFET further includes source regions 26 for electrically interconnecting the first gate electrode group and the source contact portion. These source regions 26 are connected to each other at one end of the first electrode group, and separated from each other by trench gates 18a and 18b at the other end of the same.

In addition, one end of the trench gate is connected. One source contact has a plurality of trench gates. In the embodiment, an arraying ratio between the trench gates 18 and source contacts 24 is set at 4:1. In other words, one source contact 24 is provided for four trench gates 18. Among these trench gates 18, three trench gates 18a arranged on the left side of the source contact are interconnected for one end, and separated from each other for the other end. In such a separated portion, the source region of each gate is connected through the source region 26 to the source contact 24. According to the invention, one source contact has a plurality of trench gates.

Furthermore, in the semiconductor device of the invention, all the gate electrodes of the first gate electrode group are used as MOS transistor gates. Thus, even with minimum designing space, a channel region density can be increased the feature of the power MOS transistor.

Figure 1:
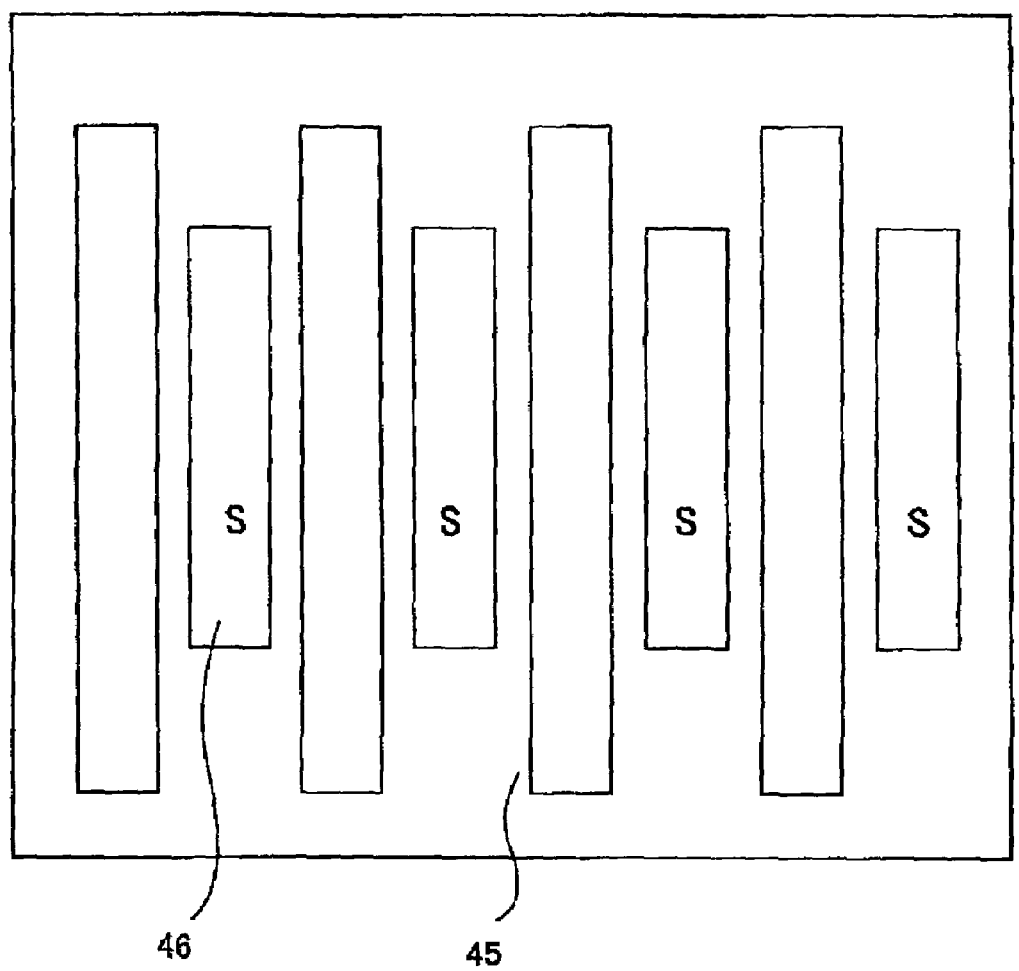
Figure 2:
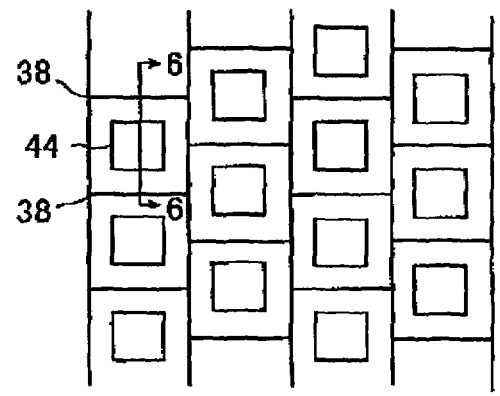
FIG. 2 is a plan view showing a pattern of a conventional offset mesh-structured MOS transistor.
Figure 3:
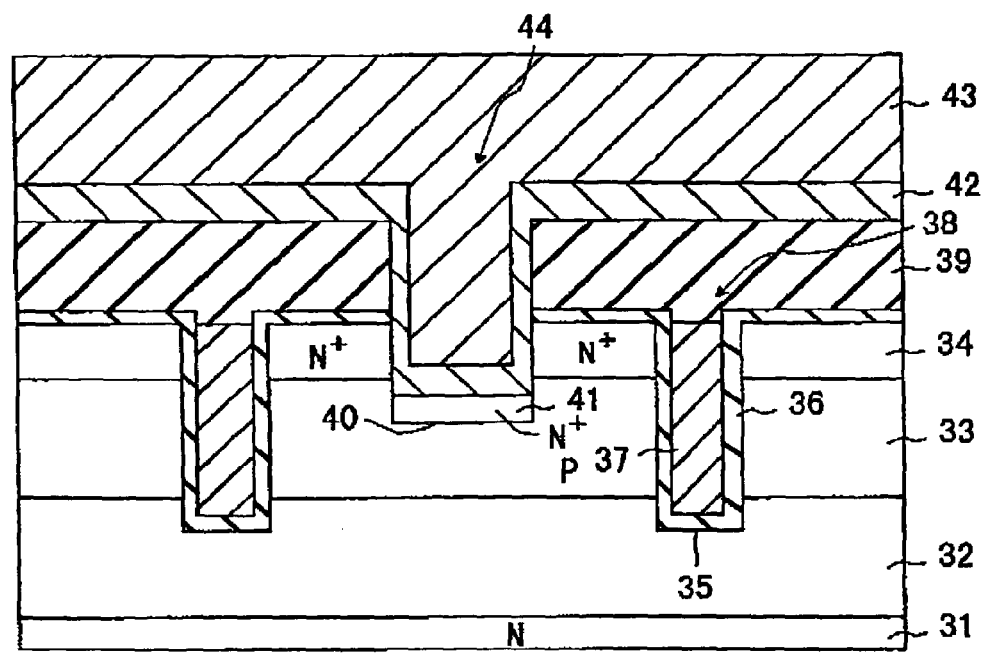
FIG. 3 is a sectional view showing a semiconductor device of a conventional technology, taken on line 6—6 of FIG. 2.
Figure 4:
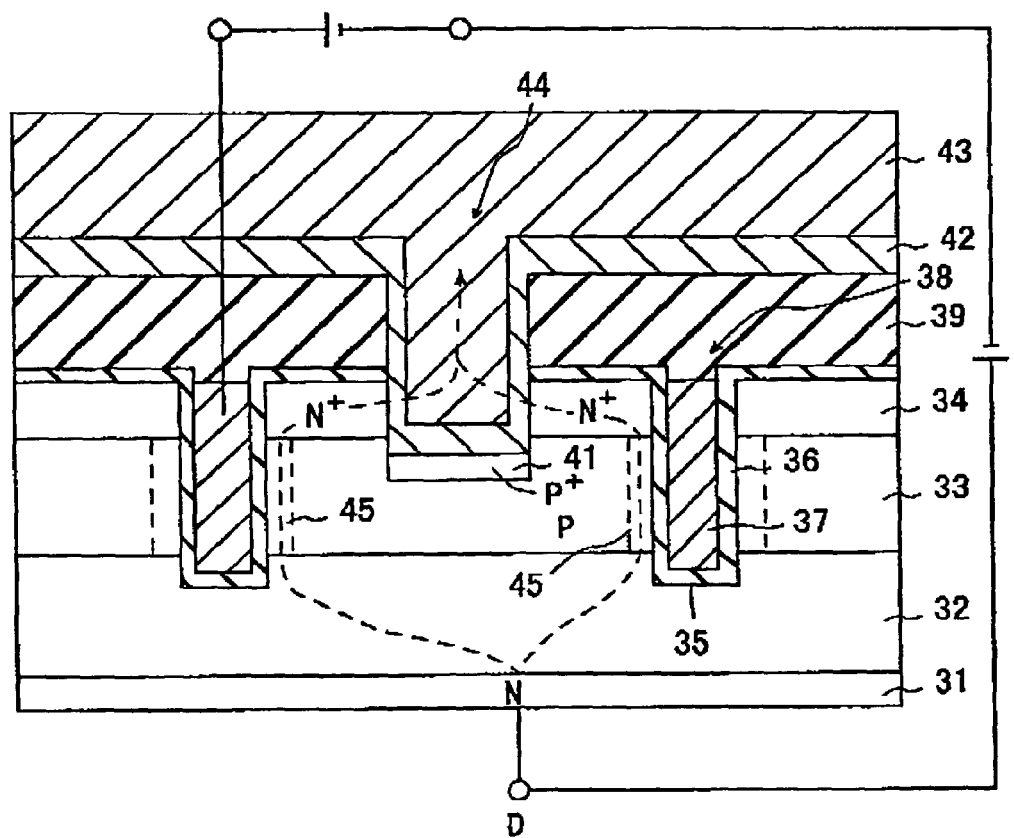
FIG. 4 is a sectional view showing a semiconductor device of a conventional technology, taken on line 6—6 of FIG. 2.

The above-described semiconductor device of the present invention finds particular utility implemented as a power MOS transistor. The power MOS transistor is designed to obtain power by interconnecting a number of micro-pattern MOSFET cells in parallel. In general, the power MOS transistor is suited for a high-speed operation because of its fast switching speed, and finds application as a switching power source, a motor control circuit, a wide-band power amplifier, and so on. Compared to the prior art, the present invention achieves a decrease in the number of source contacts and an increase in the number of trench gates for the same unit area. For example, the total area of the conventional device shown in FIG. 2 and the total area of the device of the present invention shown in FIG. 6 may be the same. In that case, the device of FIG. 6 has more room for trench gates in so far as the space (a) is smaller that the space (b). For example, in FIG. 5, the space (a) is 0.3 µm, the space (b) is 0.5 µm. The present invention thus features a decrease in the number of source contacts and a concomitant reduction in the number of spaces (b).

Figure 7:
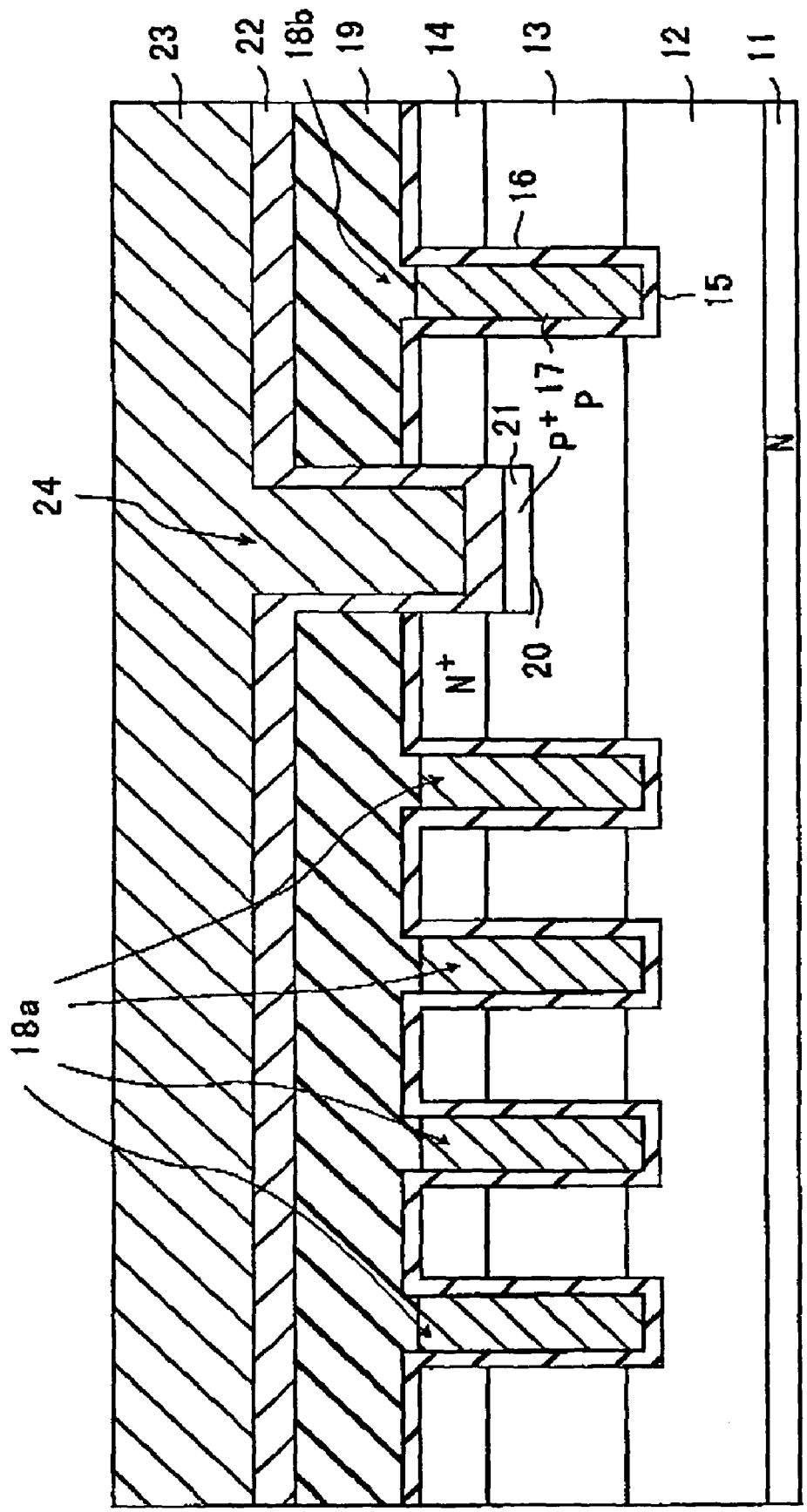
FIG. 7 is a sectional view showing a semiconductor device of the invention, taken on line 2—2 of FIG. 6.
Figure 8:
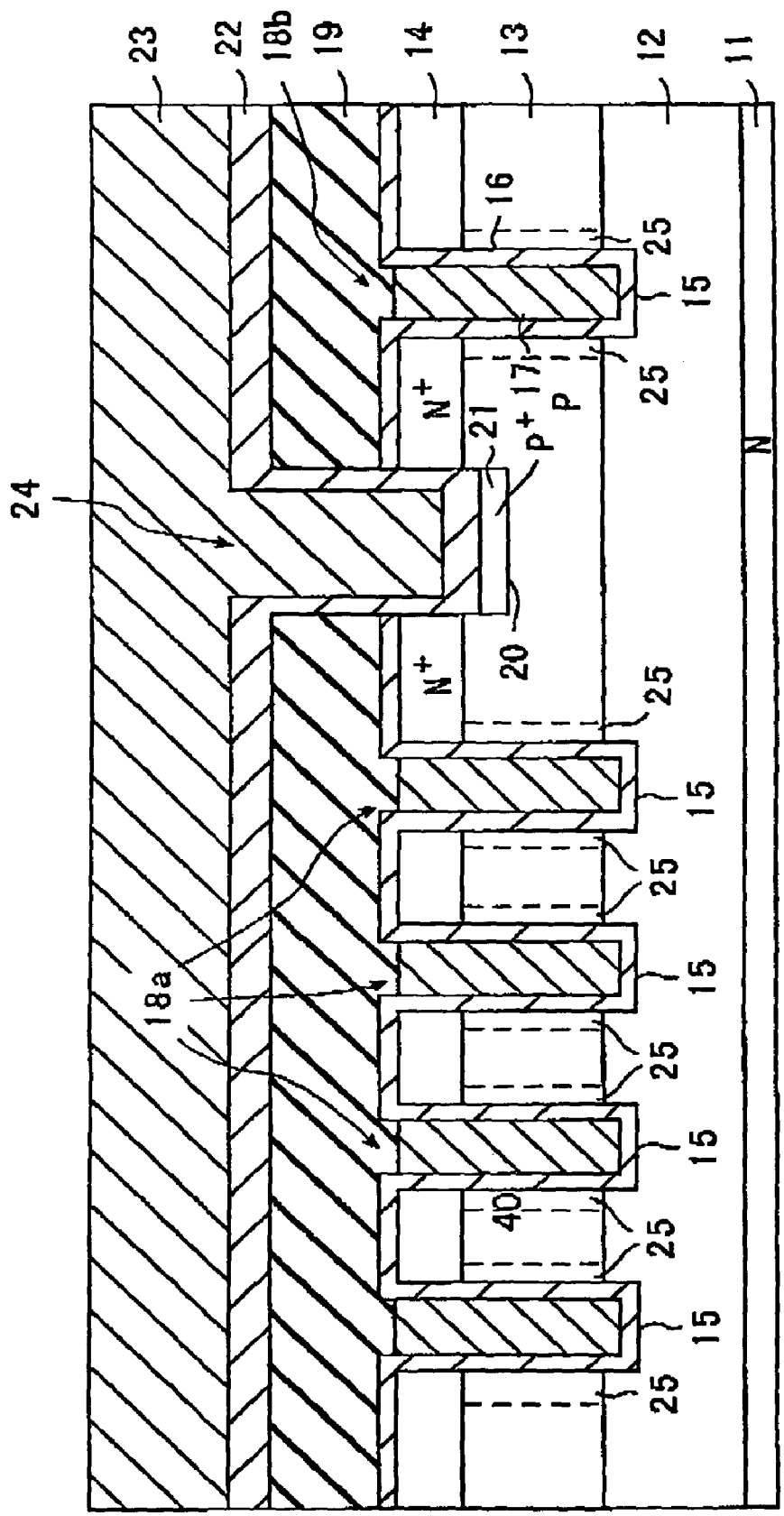
FIG. 8 is a sectional view showing a semiconductor device having channel regions according to the invention.
Figure 9:
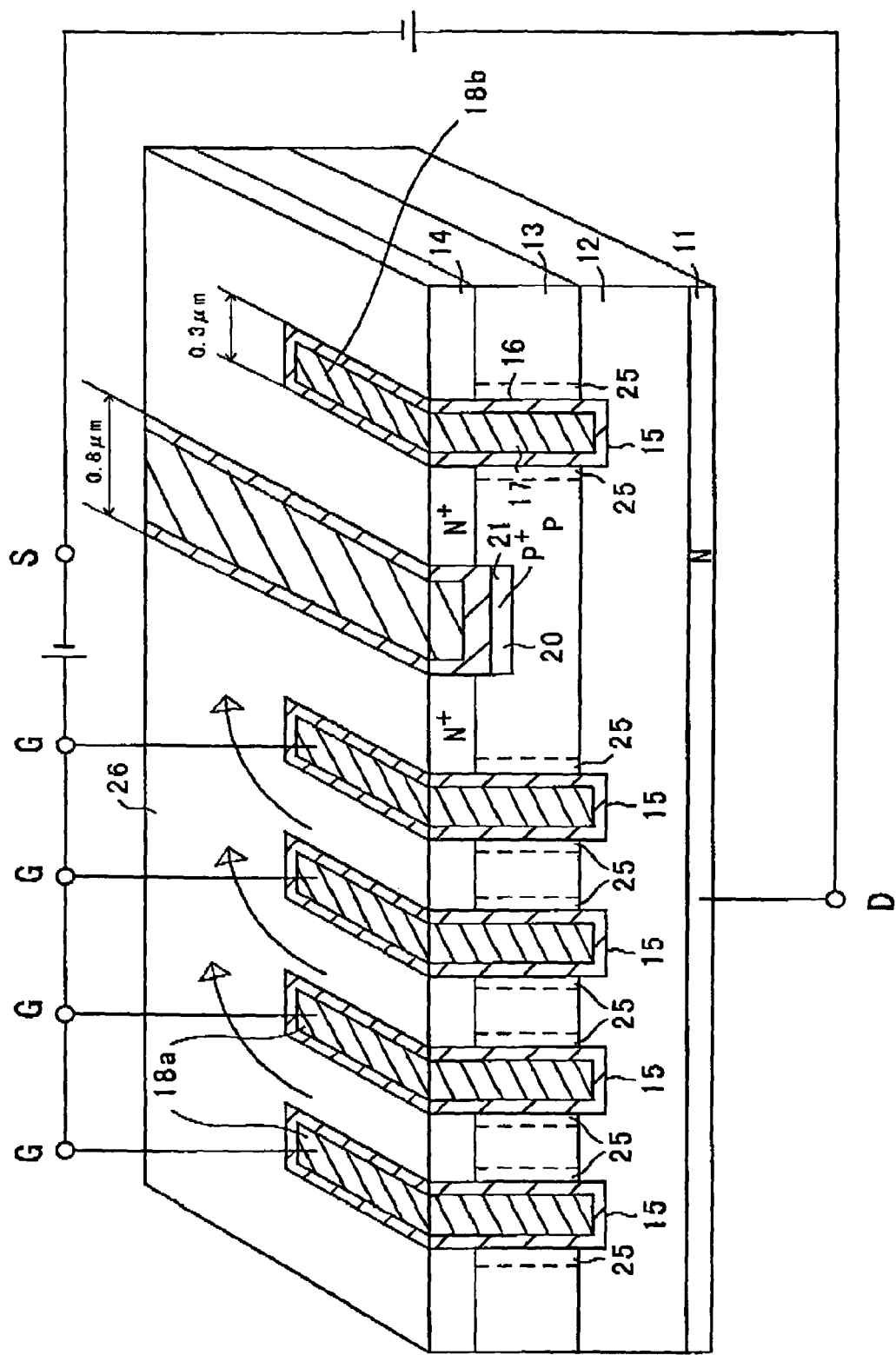
FIG. 9 is a perspective view showing the semiconductor device having the channel regions according to the invention.

Now, specific features of the invention will be described by referring to FIGS. 7 to 9, wherein FIG. 7 is a sectional view taken on line 2—2 of FIG. 6, FIG. 8 is a sectional view showing a channel forming region, and FIG. 9 is a perspective view showing the semiconductor device of FIG. 7. A manufacturing process of the power MOSFET of the invention will also be briefly described.

First, as shown in FIG. 7, for example, an N-type epitaxial layer 12 is formed on an N type semiconductor substrate 11. On the surface of this epitaxial layer 12, a double diffused layer composed of a P-type base diffused layer 13 and an N type source diffused layer 14 is formed. Then, an SiO film is formed on the source diffused layer 14, and patterned by a resist. Then, using this as a mask, the SiO film is punched. After the removal of the resist, using the SiO film as a mask, a trench 15 is formed to a depth punching through the base diffused layer 13. In this case, one end of the trenches having trench gates 18a (See FIG. 8) formed are connected to each other, while the other ends thereof are not connected. Thus, a source region 26 is formed in this unconnected portion.

Subsequently, the resist is removed. Then, a gate insulating film 16 is formed on a full surface, and a polysilicon film 17 for a gate electrode is formed on this gate insulating film 16. Then, the polysilicon film 17 is removed until the gate insulating film 16 is exposed, and a trench gate 18 is formed.

Then, to separate the trench gate 18 from a later-described source contact, an interlayer film 19 is formed on a full surface. Then, by using a resist (not shown) formed and patterned on this interlayer film 19 as a mask, the interlayer film 19 is removed, and the resist is removed. Furthermore, a gate insulating film 16, a source diffused layer 14 and a base diffused layer 13 are removed, and contact hole 20 is formed to a depth punching through the source diffused layer. Then, using the interlayer film 19 as a mask, impurity ions are implanted, and a P-type diffused layer 21 is formed in the bottom portion of the contact hole 20 inside the base diffused layer 13. Subsequently, a barrier metal layer 22 is formed, an aluminum film 23 is formed on the barrier metal layer 22, and a source contact 24 is formed.

Thus, as shown in FIG. 7, according to the invention, since one source contact 24 is used for four trench gates 18, an arraying ratio between the trench gates 18 and the source contacts 24 is set at 4:1. In the other end of the trench gate 18a, an open source connection region 26 is provided. One MOSFET set is formed based on the above arraying ratio, and a number of such MOSFET sets are interconnected in parallel on the semiconductor substrate. One MOSFET set of the embodiment is equivalent to four MOSFET sets of the conventional art.

Further as shown in FIG. 8, when a desired voltage is applied to each of trench gates 18a and 18b, a channel region 25 is formed at the side face of the trench 15. In this case, electric charges passed through the channel region 25 are taken out through the source connection region 26 from the source contact 24 located nearby.

Further as shown in FIG. 9, the source region 26 is connected at one end, and separated at the other end by the trench gate 18a. Now, when a voltage is applied to a drain on the semiconductor substrate, electric charges are carried through the channel region 25 at the side face of the trench gate toward the source contact. Since the source regions 26 are connected to each other, electric charges flowing to the side faces of the four trench gates 18a are passed through the source region 26 to reach the source contact 24. Accordingly, since a number of channel regions can be formed in a given region with a minimum designing space, a channel density can be increased, and the device resistance of the MOSFET can be set low owing to this configuration.

In addition, since one source contact has a plurality of trench gates, the number of trench gate/source contact regions can be reduced. For example, the number of spacings (b) shown in FIG. 5 can be reduced. For the spacing (a) between the trench gates shown in FIG. 5, since alignment shifting is less likely to occur compared with the spacing (b) between the trench gate and the source contact, microfabrication is possible for the MOSFET device. Thus, trench gates greater in number than in the conventional case can be formed with minimum designing space. As a result, more MOSFET sets can be connected in parallel.

According to the embodiment of the invention, the source connection region 26 is provided in the trench gate 18a, and the arraying ratio between the trench gates 18 and the source contacts 24 is set at 4:1. Hence, the area density of the channel region 25 can be increased by about 15 to 20%. As a result, low device resistance can be achieved without any problems including a short-circuit failure between the gate and the source, the leakage of current between the drain and the source, and so on.

Figure 10:
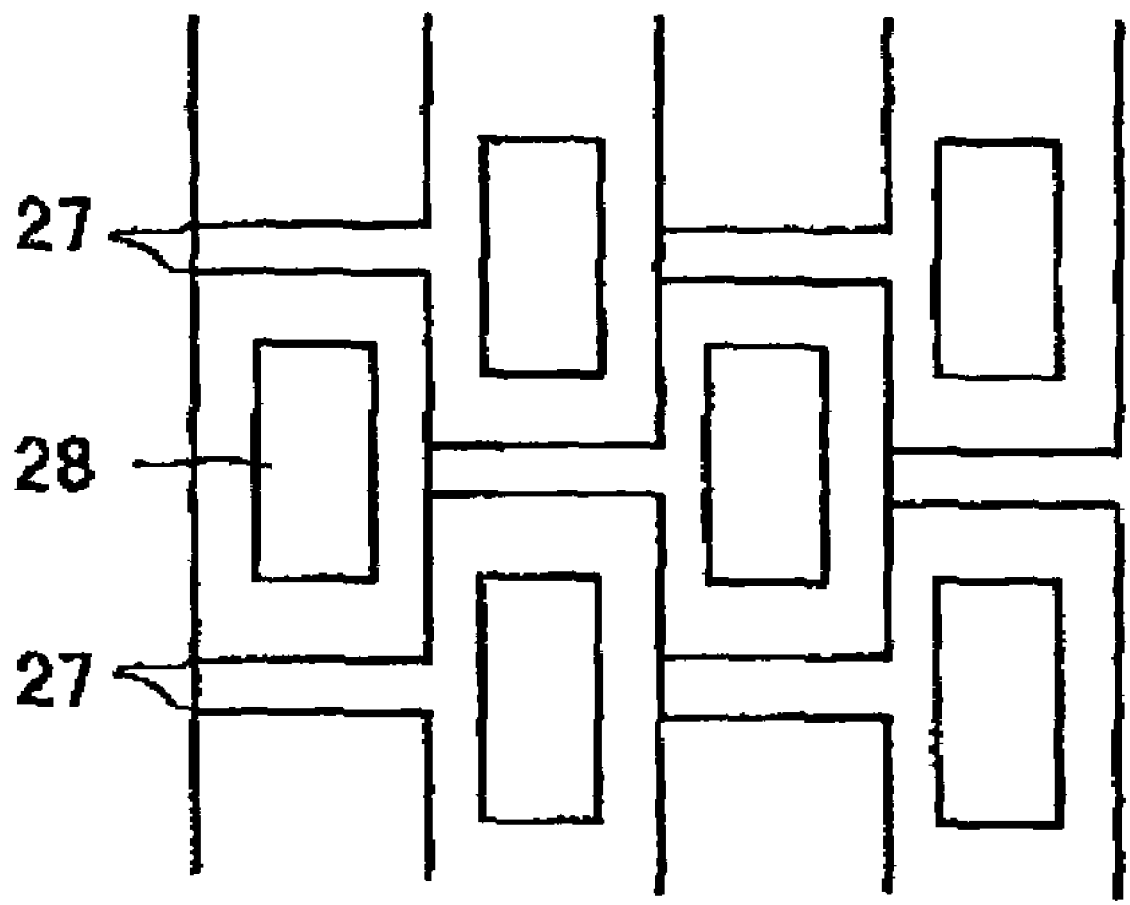
FIG. 10 is an upper surface view showing a pattern of another offset mesh structure according to the invention.

The invention should not be limited to the foregoing embodiment. For example, the arraying ratio between the trench gates and the source contacts may be set at, e.g., 3:1 other than 4:1. In addition, as shown in FIG. 10, by keeping the same density of the channel region as that in the conventional case, an arraying ratio between trench gates 27 and source contacts 28 may be set at 2:1. In such a case, since an opening of a source contact hole can be set large, e.g., 1 m, a barrier metal layer can be formed to be thick. Thus, the leakage of current between the drain and the source can be suppressed.

Furthermore, the gate may be formed on the semiconductor substrate irrespective of the trench structure.

As apparent from the foregoing, according to the invention, the channel region density can be increased, and low device resistance can be achieved. Therefore, a high operational speed semiconductor device having low ON resistance can be provided.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed, but that the invention include all embodiments falling within the scope of the appended claims.

What is claimed is as new and desired to be secured by Letters Patent of the United States is:

1. A semiconductor device comprising:
   a first gate electrode group having a plurality of gate electrodes formed on a semiconductor substrate to be away from each other at first equal spacings;
   a first gate insulating film formed on both of sidewall-surfaces opposed to each other of a first gate electrode of the first gate electrode group;
   a channel region formed along the gate insulating film on both of the sidewall-surfaces opposed to each other of the first gate electrode of the first gate electrode group;
   source diffused layers respectively between first gate electrodes of the first gate electrode group;
   a source contact having a portion formed separated from the first gate electrode of the first gate electrode group by a second spacing greater than the first spacing; and
   a source region continuously connecting at one end with the source diffused layers for electrically interconnecting the first gate electrode group and the source contact.

2. The semiconductor device of claim 1, wherein the source regions are connected to each other at one end of the first gate electrode group, and separated from each other at the other end of the first gate electrode group.

3. A semiconductor device comprising:
   a first gate electrode group having a plurality of gate electrodes formed on a semiconductor substrate to be away from each other at first equal spacings;
   a first gate insulating film formed on both of sidewall-surfaces opposed to each other of a first gate electrode of the first gate electrode group;
   a channel region formed along the gate insulating film on both of the sidewall-surfaces opposed to each other of the first gate electrode of the first gate electrode group;
   source diffused layers respectively between first gate electrodes of the first gate electrode group;
   a source contact portion formed separated from the first gate electrode group to be away from the first gate electrode group at a second spacing; and
   a source region continuously connecting at one end with the source diffused layers for electrically interconnecting the first gate electrode group and the source contact portion,
   wherein the source diffused layers are connected to each other at one end of the first gate electrode group, and separated from each other at the other end of the first gate electrode group.

4. A semiconductor device comprising:
   a first gate electrode group having a plurality of gate electrodes formed on a semiconductor substrate to be away from each other at first equal spacings;
   a first gate insulating film formed on both of sidewall-surfaces opposed to each other of a first gate electrode of the first gate electrode group;
   a first channel region formed along the gate insulating film on both of the sidewall-surfaces opposed to each other of the first gate electrode of the first gate electrode group;
   first source diffused layers respectively between first gate electrodes of the first gate electrode group;
   a second gate electrode group having a plurality of gate electrodes formed on the semiconductor substrate to be away from each other at the first equal spacings;
   a second gate insulating film formed on both of sidewall-surfaces opposed to each other of a first gate electrode of the second gate electrode group;
   a second channel region formed along the gate insulating film on both of the sidewall-surfaces opposed to each other of the first gate electrode of the second gate electrode group;
   second source diffused layers respectively between first gate electrodes of the second gate electrode group;
   a source contact portion formed separated between the first and second gate electrode groups to be away from the first and second gate electrode groups at a second spacing; and
   a source region continuously connecting at one end with the first source diffused layers for electrically interconnecting the first gate electrode group and the source contact portion,
   wherein the first source diffused layers are connected to each other at one end of the first gate electrode group, and separated from each other at the other end of the first gate electrode group.

5. A semiconductor device according to claim 4, wherein the gate electrodes of the first group are connected to each other at the other end.

6. A semiconductor device according to claim 4, wherein the first and second gate electrode groups are formed in trench structures.

7. A semiconductor device according to claim 4, wherein each of the source regions is a diffused layer formed on the semiconductor substrate.

8. A semiconductor device according to claim 4, wherein the source contact and the first gate electrode group constitute one MOS transistor.

9. A semiconductor device according to claim 4, further comprising a source electrode on the semiconductor substrate,
wherein the source contact portion is an electrode drawn from the source electrode.

10. A semiconductor device according to claim 4, wherein all the gate electrodes of the first gate electrode group are used as gates for a MOS transistor.

11. A semiconductor device comprising:
a first gate electrode group having a plurality of gate electrodes formed on a semiconductor substrate to be away from each other at first equal spacings;
a first gate insulating film formed on both of sidewall-surfaces opposed to each other of a first gate electrode of the first gate electrode group;
a first channel region formed along the gate insulating film on both of the sidewall-surfaces opposed to each other of the first gate electrode of the first gate electrode group;
first source diffused layers respectively between first gate electrodes of the first gate electrode group;
a second gate electrode group having a plurality of gate electrodes on the semiconductor substrate to be away from each other at the first equal spacings;
a second gate insulating film formed on both of sidewall-surfaces opposed to each other of a first gate electrode of the second gate electrode group;
a second channel region formed along the gate insulating film on both of the sidewall-surfaces opposed to each other of the first gate electrode of the second gate electrode group;
second source diffused layers respectively between first gate electrodes of the second gate electrode group;
a third gate electrode group having a plurality of gate electrodes formed on the substrate to be away from each other at the first equal spacings;
a third gate insulating film formed on both of sidewall-surfaces opposed to each other of a first gate electrode of the third gate electrode group;
a third channel region formed along the gate insulating film on both of the sidewall-surfaces opposed to each other of the first gate electrode of the third gate electrode group;
a third source diffused layer between first gate electrodes of the third gate electrode group;
a first source contact portion formed between the first and second gate electrode groups to be away from the first and second gate electrode groups at a second spacing;
a second source contact portion formed between the second and third gate electrode groups to be away from one selected from the second and third gate electrode groups at the second spacing;
a first source region continuously connecting at one end with the first source diffused layers, the first source region which electrically interconnects the first gate electrode group, and the first source contact portion; and
a second source region continuously connecting at one end with the second source diffused layers, the second source region which electrically interconnects the second gate electrode group, and the second source contact portion,
wherein the first source diffused layers are connected to each other at one end of the first gate electrode group and are separated from each other at the other end of the first gate electrode group, and the second source diffused layers are connected to each other at one end of the second gate electrode group and are separated from each other at the other end of the second gate electrode group.

12. A semiconductor device according to claim 11, wherein the first and second gate electrode groups are connected to each other at the other end.

13. A semiconductor device according to claim 11, wherein the first and second gate electrode groups are formed in trench structures.

14. A semiconductor device according to claim 11, wherein each of the first and second source regions is a diffused layer formed on the semiconductor substrate.

15. A semiconductor device according to claim 11, wherein the first source contact portion and the first gate electrode group constitute one MOS transistor, and the second source contact portion and the second gate electrode group constitute another MOS transistor.

16. A semiconductor device according to claim 11, wherein each of the first and second source contact portions is an electrode drawn from a source electrode, and these portions are connected to each other.

17. A semiconductor device according to claim 11, wherein all the gate electrodes of the first and second gate electrode groups are used as gates for MOS transistors.

18. A semiconductor device according to claim 11, wherein the second spacing is greater than the first spacing.

* * * * *